United States Patent [19]

Gordon et al.

[11] Patent Number: 4,913,656

[45] Date of Patent: Apr. 3, 1990

[54] ELECTRICAL CONNECTOR

[75] Inventors: Herman B. Gordon, Phoenix, Ariz.; Mark J. Owens, Vernon; Scott Simpson, Woodstock, both of Conn.

[73] Assignee: Rogers Corporation, Rogers, Conn.

[21] Appl. No.: 334,939

[22] Filed: Apr. 7, 1989

[51] Int. Cl.$^4$ .............................................. H01R 9/09
[52] U.S. Cl. ....................................... 439/67; 439/77; 439/493; 439/75
[58] Field of Search ..................... 439/67, 74, 75, 77, 439/453, 492, 493

[56] References Cited

U.S. PATENT DOCUMENTS

| 4,538,865 | 9/1985 | Wakabayashi et al. | 439/67 |
|---|---|---|---|
| 4,695,258 | 9/1987 | Hanson et al. | 439/67 |
| 4,768,971 | 9/1988 | Simpson | 439/67 |
| 4,770,645 | 9/1988 | Antes | 439/493 |
| 4,832,609 | 5/1989 | Chung | 439/67 |

Primary Examiner—P. Austin Bradley
Attorney, Agent, or Firm—Fishman, Dionne & Cantor

[57] ABSTRACT

An electrical connector is presented for effecting a non-wiping pressure mated connection between at least a pair of flexible circuits and another circuit device in a compact package with allowance for very tight tolerances on pad width and spacing.

21 Claims, 4 Drawing Sheets

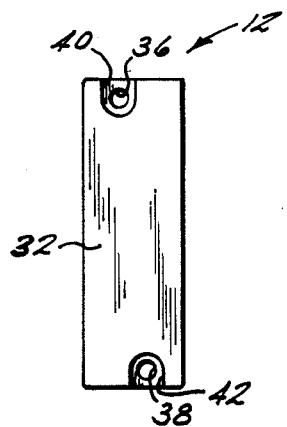
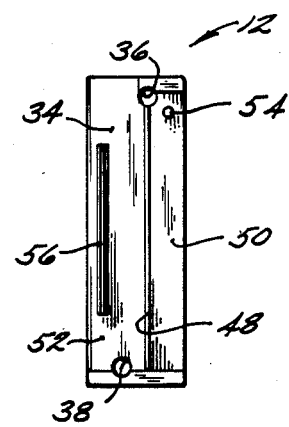
FIG. 3  FIG. 4  FIG. 5
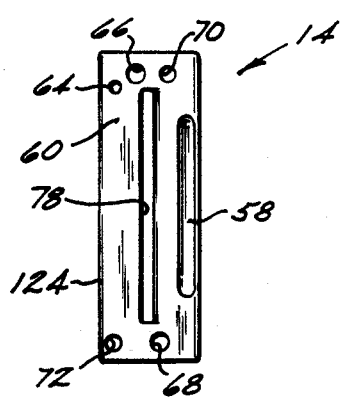
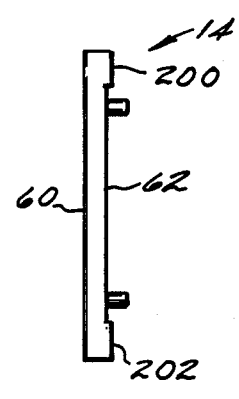
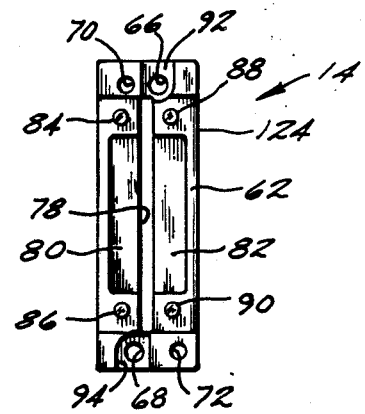
FIG. 6  FIG. 7  FIG. 8
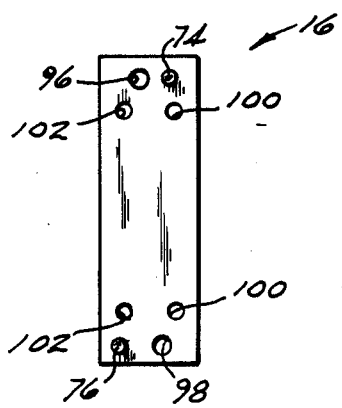
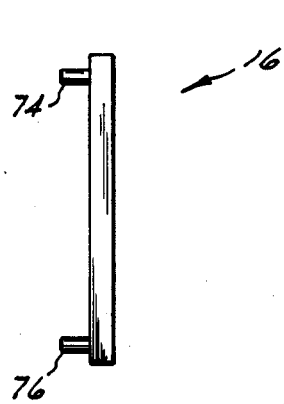
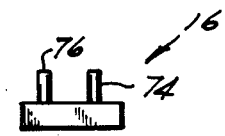
FIG. 9  FIG. 10  FIG. 11

ELECTRICAL CONNECTOR

BACKGROUND OF THE INVENTION

This invention relates to an apparatus for interconnecting electrical circuit elements. More particularly, this invention relates to a new and improved electrical connector and method of using the same for establishing electrical contact between a pair of flexible circuits and another circuit device.

Conventional methods of interconnecting electrical or electronic circuit components consist of the use of separate connector structures and/or soldering terminals on the components to conductors which deliver current to or from the components. While generally suitable for its intended purposes, interconnecting electrical components via separate connector structures does suffer from certain drawbacks and deficiencies including high manufacturing and purchasing costs during installation and connection. Similarly, soldering terminals is undesirable as the substrate which supports an exposed terminal must be able to withstand relatively high temperatures with no adverse effects. Also, soldering connections can be time consuming and therefore be labor intensive and expensive. Another problem with soldered connections is the relative difficulty in disconnecting a soldered terminal during repairs and manufacturing.

In some applications it has been found desirable to replace the use of separate connecting structures and/or soldering as a technique for use in establishing connections to flexible and other circuits. In these applications, the requisite electrical contact may be established by mechanically pressing the terminal portions of the circuit against terminal pads on the connector, device or another circuit. Such prior art pressure connections are customarily made with the aid of a resilient pressure applicator, such as an elastomeric member, which is placed in compression to bias at least one of the components to be electrically interconnected toward the other component to hold the terminal portions thereof in electrical contact.

Such a solderless connection system is disclosed in U.S. Pat. No. 4,468,074 assigned to the assignee hereof and incorporated herein by reference.

U.S. Pat. No. 4,468,074 discloses an apparatus wherein contact portions of a first array of conductive elements are urged against mating contacts of a second array of conductive elements by a pressure applicator comprising a resilient cellular plastic material thereby establishing and maintaining an electrical connection therebetween. The use of such a cellular resilient material permits a plurality of closely spaced exposed electrical conductors on or extending from a pair of substrates to be aligned and thereafter reliably pressed together, with the electrical connections being established by a requisite contact pressure applied to the substrates. The solderless connector of U.S. Pat. No. 4,468,074 may be employed to interconnect flexible circuits; to connect flexible circuits on rigid substrates; to establish connections between the leads extending from integrated circuit in a circuit pattern on a flexible or rigid circuit board; and in other applications.

Still other prior art solderless connectors are disclosed in U.S. Pat. Nos. 4,468,074; 4,647,125; 4,655,524; 4,691,972; 4,717,345; 4,744,764 and 4,768,971.

It will be appreciated that the above-noted prior art solderless connectors typically relate to the connection between a flexible circuit and another flexible or rigid circuit device. However, there are many applications requiring at least two flexible circuits to be connected to a third flexible or rigid circuit device. Unfortunately, none of the known prior art solderless connector assemblies are particularly well suited for such a connection scheme.

SUMMARY OF THE INVENTION

The above discussed and other problems and disadvantages of the prior art are overcome or alleviated by the electrical connection technique and apparatus of the present invention. In accordance with the present invention, an electrical connector is provided for establishing electrical contact between two flexible circuits and a third circuit (either a rigid or flexible circuit board). The alignment method used for all flexible circuits provides very tight tolerance on pad spacing/width allowing easy assembly and disassembly.

The connector of this invention comprises two of the flexible circuits being mounted to a clamp sub-assembly with the other circuit device located on a clamp backer plate. The sub-assembly locates the flexible circuit in the appropriate area and provides the elastomeric pressure member in the contact area. The sub-assembly also provides a strain relief for the two flexible circuits to protect the contact area both before and after connection. The assembled connector is held in the assembled position with two screws tightened to where the hardware parts engage "stops" protecting the clamp from bowing but allowing high enough torque on the fasteners to resist subsequent vibration.

The connection system of the present invention allows at least two flex circuits to be connected to a third circuit (either flexible or rigid). The system is easily mated and demated and provides adequate alignment. The system also is resistant to vibrations from the operating environment and permits a compact package with allowance for very tight tolerances on pad width and spacing.

The above-discussed and other features and advantages of the present invention will be appreciated and understood by those of ordinary skill in the art from the following detailed description and drawings.

BRIEF DESCRIPTION OF THE DRAWINGS:

Referring now to the drawings, wherein like elements are numbered alike in the several FIGURES:

FIG. 3 is a top plan view of a clamp plate used in the connector of FIG. 1;

FIG. 4 is a side elevation view of the clamp plate of FIG. 3;

FIG. 5 is a bottom plan view of the clamp plate of FIG. 3;

FIG. 6 is a top plan view of the circuit block used in the connector of FIG. 1;

FIG. 7 is a side elevation view of the circuit block of FIG. 6;

FIG. 8 is a bottom plan view of the circuit block of FIG. 6;

FIG. 9 is a top plan view of the backer plate used in the connector of FIG. 1;

FIG. 10 is a side elevation view of the backer plate of FIG. 9;

FIG. 11 is an end view of the backer plate of FIG. 9;

DESCRIPTION OF THE PREFERRED EMBODIMENT

Figure 1:
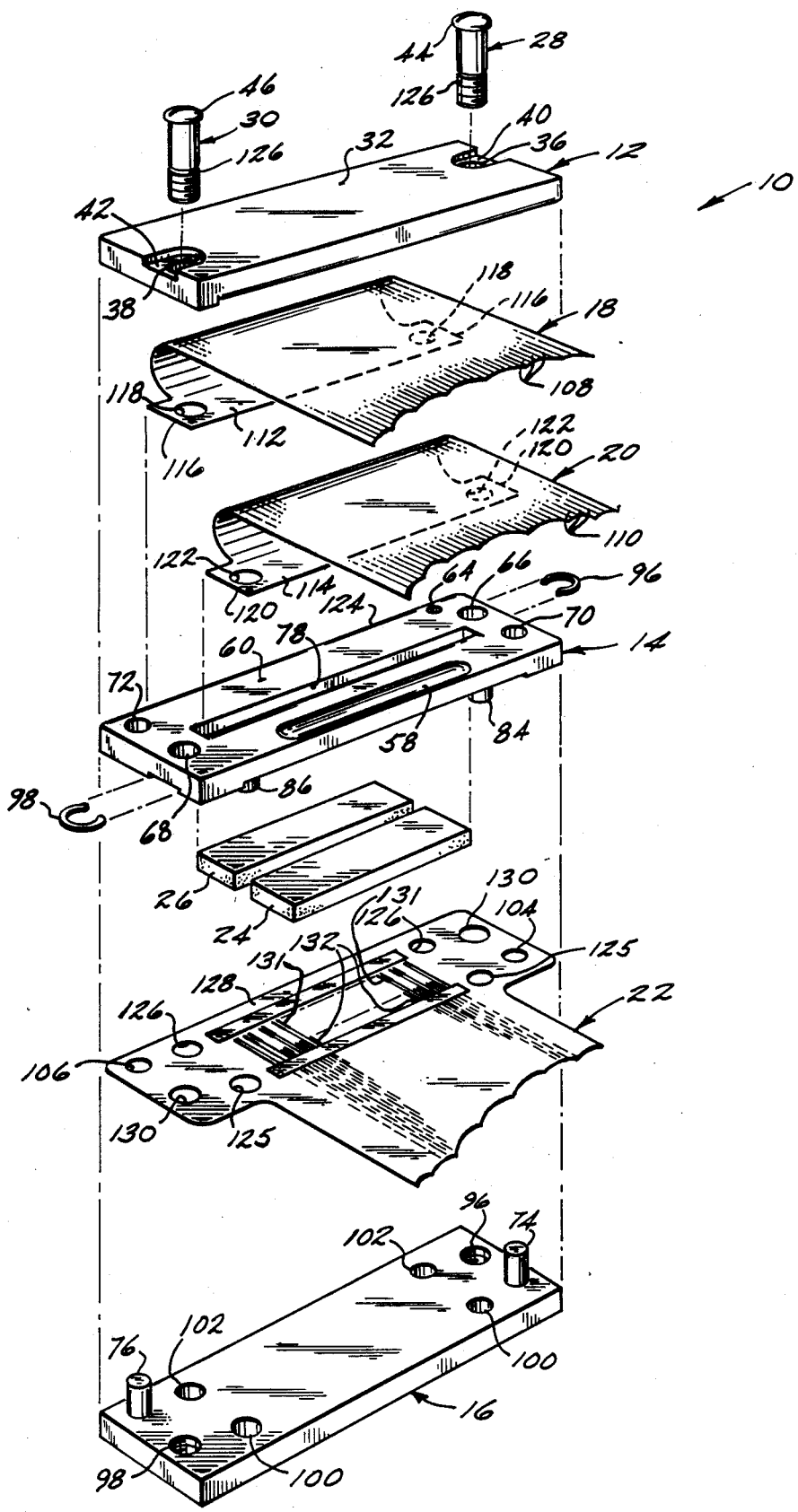
FIG. 1 is an exploded perspective view of the solderless connector in accordance with the present invention.
Figure 2:
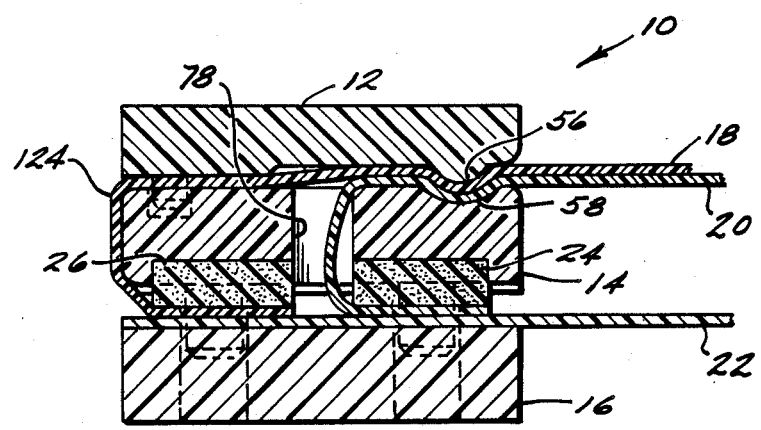
FIG. 2 is a cross-sectional elevation view through the connector of FIG. 1 subsequent to assembly.

Referring first to FIGS. 1 and 2, a solderless connector in accordance with the present invention is shown generally at 10. Connector 10 comprises three primary parts, all of which are preferably molded. These parts include an upper clamp plate (which is shown in more detail in FIGS. 3-5), a centrally located circuit block 14 (which is shown in more detail in FIGS. 6-8) and a lower backer plate 16 (which is shown in more detail in FIGS. 9-11). The three components 12, 14 and 16 are preferably molded from a suitable insulative material such as an engineering thermoset. A preferred engineering thermoset is a molding material sold under the trade name RX640 by Rogers Corporation, assignee of the present application. Molded components 12, 14 and 16 all cooperate to effect electrical and mechanical communication between a pair of flexible circuits identified at 18 and 20 and a third circuit board which may either be flexible or rigid and is identified at 22. It will be appreciated that circuit block 14 and clamp plate 12 act to sandwich therebetween both flexible circuits 18 and 20 to define a sub-assembly together with a pair of elastomeric pressure pads 24 and 26 and a pair of mechanical fasteners 28 and 30.

Referring now to FIGS. 3-5, clamp plate 12 has a generally rectangular configuration and includes a top surface 32 and a bottom surface 34. Each end of clamp plate 12 has an opening (identified at 36 and 38, respectively) therethrough. It will be appreciated that openings 36 and 38 are offset with respect to one another. A U-shaped counter-bore 40 and 42 is provided on top surface 32 in alignment with each respective opening 36 and 38. Counterbores 40 and 42 receive a flat head 44 and 46 from each screw fastener 28 and 30 so that said flat heads 44 and 46 will be flush with top surface 32 of clamp plate 12 subsequent to assembly thereof. Bottom surface 34 of clamp plate 12 includes a shoulder 48 along the length thereof which defines a raised portion 50 and a depressed portion 52 on bottom surface 34. Raised portion 50 includes an alignment pin 54 which extends outwardly from one end thereof. Depressed portion 52 of bottom surface 34 includes an elongated ridge 56 which, as will be discussed in greater detail below, mates with a groove 58 in circuit block 14 for effecting appropriate strain relief.

Turning now to FIGS. 6-8, circuit block 14 is also substantially rectangular and similarly includes a top surface 60 and a bottom surface 62. As mentioned, top surface 60 includes a shallow groove 58 which is sized to receive ridge or extension 56 from clamp plate 12. Top surface 60 also includes a small apertured recess 64 which mates with alignment pin 54 from clamp plate 12 and acts to align clamp plate 12 to circuit block 14 during assembly. Two pairs of through openings are provided on either end of circuit block 14. A first pair of openings 66 and 68 are sized to align and mate with openings 36 and 38, respectively from clamp plate 12. A second pair of openings 70 and 72 are sized and aligned to mate with a pair of respective pins 74 and 76 which extend upwardly from backer plate 16 as will be discussed hereinafter. Finally, an elongated rectangular slot 78 extends through circuit block 14 along the length thereof and is located approximately in the center of block 14. Slot 78 is sized to receive flexible circuit 20 as will be discussed hereinafter. As shown in FIGURE 8, bottom surface 62 of circuit block 14 includes a pair of recesses 80 and 82 which are positioned on either side of slot 78. Recesses 80 and 82 are sized to receive elastomeric pads 24 and 26, respectively. Spaced a short distance from the opposed ends of recess 80 are a pair of lugs 84 and 86. Similarly, on opposed ends of recess 82 are a pair of lugs 88 and 90. Lastly, a counter-bore 92 is located on back surface 62 in alignment with opening 66. Similarly, a counter-bore 94 is formed in alignment with opening 68. As will be discussed, counter-bores 92 and 94 are sized to receive snap ring 96 and 98, respectively (see FIG. 1) during assembly.

Turning now to FIGS. 9-11, backer plate 16 is again substantially rectangular and includes a pair of threaded through holes 96 and 98 which are positioned to align and mate with through holes 66 and 68 in circuit block 14 and through holes 36 and 38 in clamp plate 12. Thus, when clamp plate 12, circuit block 14 and backer plate 16 are aligned, threaded fasteners 28 and 30 are received in the aligned openings and are threadably mated. Backer plate 16 also includes two pairs of apertures 100 and 102. It will be appreciated that apertures 100 are sized and positioned to receive lugs 84 and 86 from circuit block 14; while apertures 102 are sized and positioned to receive and retain lugs 88 and 90 from circuit block 14. As mentioned above, extension 74 and 76 are sized and positioned to be received in openings 70 and 72, respectively. In addition, pins 74 and 76 are received in a pair of corresponding openings 104 and 106 in circuit board 22 (see FIG. 1).

Referring again to FIGS. 1 and 2, the subassembly of clamp plate 12 and circuit block 14 will now be discussed. It will be appreciated that circuit block 14 provides a means for locating the elastomeric pressure members 24 and 26 behind the two flex circuits 18 and 20 which become part of the clamp subassembly. Flex circuits 18 and 20 are performed so as to terminate in a loop as shown in FIG. 1. Each flexible circuit 18 and 20 includes a plurality of circuit traces 108 and 110, respectively, which terminate on the under surface of the looped terminal portions 112 and 114. Terminal portion 112 includes lateral extension members 116 which house openings 118. Similarly, terminal portion 114 includes lateral extensions 120 which house openings 122. Flex circuit 20 has its loop portion passed through slot 78 so that the terminal portion 114 and recess 80 (on lower surface 62 of circuit block 14) sandwich therebetween pressure pad 24. Simultaneously, lugs 84 and 86 are received by openings 122 of terminal portion 114 to thereby align and retain circuit 20 in a preselected position. Flexible circuit 18 is mounted over flexible circuit 20 and is looped about a side surface 124 of circuit block 14 so that terminal Portion 112 and recess 82 (on lower surface 62 of circuit block 14) sandwich therebetween pressure pad 26. Again, lugs 88 and 90 are received by openings 118 of terminal portion 112 to thereby align flexible circuit 18 in a preselected position.

After flexible circuits 18 and 20 have been mounted as discussed on circuit block 14, clamp plate 12 is positioned on top surface 60 of circuit block 14 so that alignment pin 54 of clamp plate 12 is received by aperture 64 in circuit block 14. Simultaneously, openings 36 and 38 in clamp plate 12 are aligned respectively with openings 66 and 68 in circuit block 14 so that both flexible circuits 18 and 20 are sandwiched between clamp plate 12 and circuit block 14. Next, mechanical fasteners 28 and 30 are received in aligned openings 36, 66 and 38, 68. After fasteners 28 and 30 are extended through the aligned openings, a known semi-circular metal snap-ring 96 and 98 is then locked into a machined groove 126 in each fastener 28, 30. At this point, the clamp plate is held permanently to the circuit block causing the flexible circuits to bend through the path created by the ridge 56 and groove 58 thereby providing the necessary strain relief. Snap-rings 96 and 98 maintain a tight fit but yet allow the fasteners 28, 30 to rotate when the strain relief is complete so that connection to the circuit device 22 and backer plate 16 can occur. Also, fastener heads 44 and 46 will seat in counter-bores 40 and 42. It will be appreciated that flexible circuit 18 has a slightly longer length than flexible circuits 20. This longer length allows for the extra distance that flexible circuit 18 must travel in the clamp subassembly before being looped about side surface 124 of circuit block 14. Of course, flexible circuit 20 must have a shorter length relative to flexible circuit 18 as flexible circuit 20 passes through slot 78 and therefore has a shorter travel path.

The sub-assembly described above may now be mated to circuit device 22 which, as mentioned, may be either of rigid or flexible construction. Circuit device 22 includes a terminal portion 128 having two sets of exposed circuit traces 131 and 132. It will be appreciated that the set of circuit traces 131 is constructed to align and mate with corresponding circuit traces on the terminal portion 112 of flexible circuit 18; while circuit traces 132 are constructed to align and mate with corresponding circuit traces 110 which are exposed on the terminal portion 114 of flexible circuit 20. Circuit device 22 is positioned on backer plate 16 so that extended pins 74 and 76 mate with respective openings 104 and 106.

When the sub-assembly described above is brought into contact with backer plate 16 and circuit device 22, the pair of pins 84 and 86 are received in openings 100 in backer plate 16; and the pair of pins 88 and 90 are received in openings 102 in backer plate 16. Also, pins 84 and 86 will pass through a first pair of aligned apertures 125 in circuit device 22; while pins 88 and 90 will pass through a second pair of aligned apertures 126 in circuit device 22. Finally, a third pair of apertures 130 are formed through circuit device 22 so as to align with threaded openings 96 and 98 in backer plate 16. Thus, as the sub-assembly is mated to circuit device 22 in backer plate 16, threaded fasteners 28 and 30 will pass through openings 130 in circuit device 22 and into threaded openings 96 and 98. Fasteners 28 and 30 are then threaded and engaged to openings 96 and 98 thereby mating the sub-assembly to backer plate 16.

It will be noted that snap-rings 96 and 98 allow threaded fasteners 28 and 30 to turn while retaining the sub-assembly in tight engagement. It will be appreciated that the asymmetric Pattern of pins 74 and 76 in backer plate 16 provides a means for polarizing the clamp sub-assembly to backer plate 16 and circuit device 22 to thereby assure correct assembly of the overall connector 10. Preferably, the bottom circuit device 22 is tacked to backer plate 16 with a suitable adhesive and clearances are such that the circuit device 22 and backer plate 16 as a unit can "float" in order to engage the two sets of pins 84, 86 and 88, 90 on the back surface 62 of circuit block 14. Hence, the same four pins both locate and align all of the circuits 18, 20 and 22 thereby reducing the dimensions and tolerances that effect contact pad alignment. It will be appreciated that the particular configuration shown in FIG. 1-11 have been successful in providing a circuit pattern with five mil pads at fifteen mil centers.

With the clamp sub-assembly located to the circuit 22/backer plate 16, the two fasteners 28 and 30 are tightened thereby compressing the elastomeric pads 24 and 26 which then provides the necessary clamping force to the contact pad areas. The fasteners are tightened to the torque required to resist vibration in the operating environment and in so doing, the stops 200 and 202 located on the bottom of the circuit block 14 hit the top of the circuit 22/backer plates 16 sub-assembly thus limiting the motion in the clamp area. In that manner, the clamping force on the contact pads is controlled within the desired range based on the tolerances involved.

It will be appreciated that while two flexible circuits 18 and 20 have been shown connected to a third circuit device 22, the present invention contemplates that any number of flexible circuits may be used in conjunction with the upper sub-assembly. Thus, for example, several spaced slots such as shown at 78 may be utilized in a circuit block to thereby permit three or more flexible circuits to be used in conjunction with the present invention.

Figure 12:
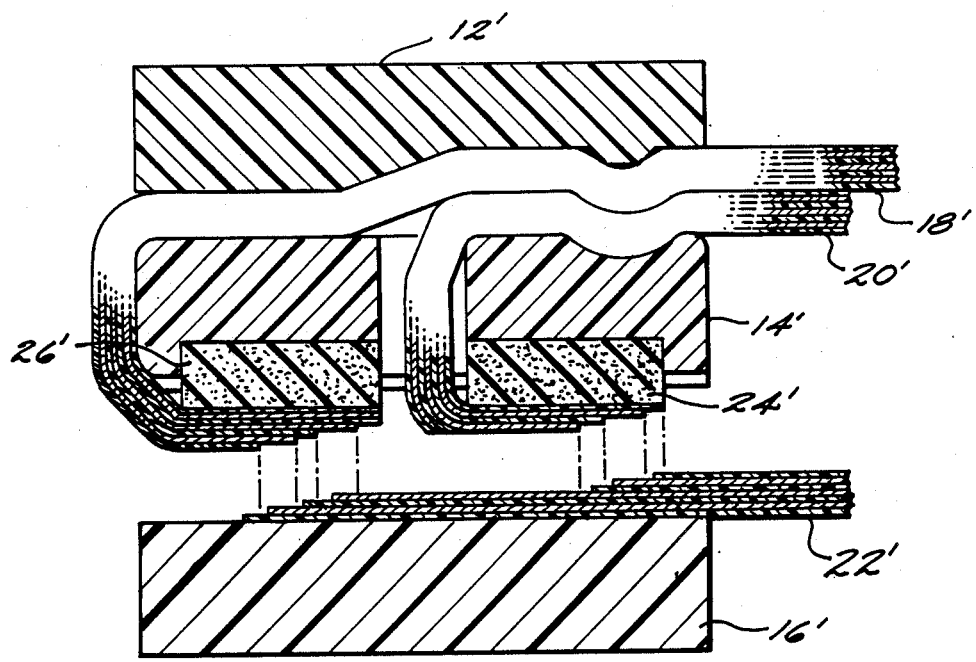
FIG. 12 is a cross-sectional elevation view, similar to FIG. 2, depicting the connector of FIG. 1 used in conjunction with multi-layer circuits.

The present invention may also be used in conjunction with multi-layer circuit devices. For example, referring now to FIG. 12, an alternative embodiment of the present invention is shown wherein a pair of multi-layer flexible circuits 18' and 20' are shown subsequent to connection to a multi-layer circuit device 22'. In FIG. 12, it will be appreciated that all elements which are identical or similar to corresponding elements shown in FIGS. 1-11 utilize the same identification numeral with the addition of a prime. When effecting electrical connection between multi-layer circuit devices, in the preferred embodiment of the present invention, a "stairstep" construction wherein each circuit trace terminates in a staggered position relative to the next circuit trace is utilized. Such a stairstep construction compensates for the finite thickness of each circuit layer and the potential ill effects on the connector's performance if these layers are not taken into account. The stairstep construction shown in FIG. 12 is similar in concept to the stairstep construction described in U.S. Pat. No. 4,691,972 which is owned by the assignee hereof and incorporated herein by reference. In the particular embodiment shown in FIG. 12, each multi-layer circuit 18' and 20' utilizes a central layer of signal traces sandwiched between a pair of ground layers, all of which are spaced by a plurality of layers of flexible insulative material. Circuit device 22' also includes a central layer of signal trace sandwiched between upper and lower ground layers which mate with respective signal and ground layers on flexible circuits 18' and 20'.

Figure 13:
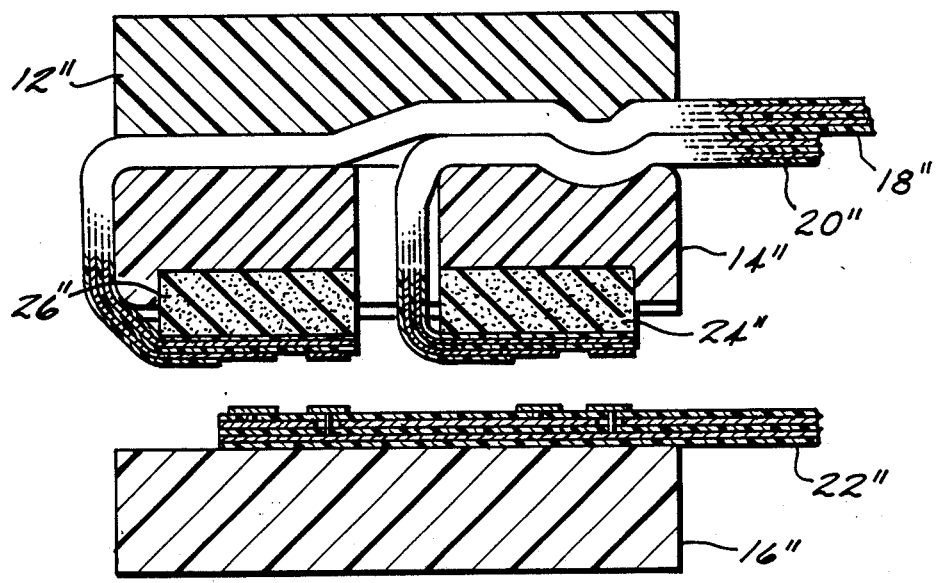
FIG. 13 is a cross-sectional elevation view, similar to FIG. 12, depicting a connector in accordance with the present invention in conjunction with a multilayer circuit of single plane construction.

FIG. 13 depicts an embodiment of the present invention which is identical to the embodiment of FIG. 12. The only difference is that in FIG. 13, multilayer circuits 18", 20" and 22" have a well known single plane termination circuit construction as opposed to the stairstep construction of circuits 18', 20' and 22' in FIG. 12.

In still another embodiment of the present invention, the two or more flexible circuits may include an additional loop so as to protrude outwardly and loop about the clamp plate to expose additional circuit traces on the top surface of the clamp plate. In this way, contact areas could be formed on the top of the connector sub-assembly similar to the bottom so as to produce a non-wiping "stack" connector that could be sandwiched between two boards or flexible circuits.

The connector of the present invention thus provides a means of effecting a non-wiping pressure mated connection between at least a pair of flexible circuits and another circuit device in a compact package with allowance for very tight tolerances on pad width and spacing.

While preferred embodiments have been shown and described, various modifications and substitutions may be made thereto without departinq from the spirit and scope of the invention. Accordingly, it is to be understood that the present invention has been described by way of illustrations and not limitation.

What is claimed is:

1. An electrical connector for connecting at least two flexible circuits to another circuit device, comprising:
    clamp plate means having a pair of opposed first openings, said clamp plate means having a top and bottom surface;
    circuit block means having a pair of opposed second openings, said circuit block means also having at least one longitudinal slot therethrough, said slot being dimensioned to receive a flexible circuit therethrough, said circuit block means having an upper and lower surface, said lower surface including first retaining means for receiving a first resilient pressure pad and second retaining means for receiving a second resilient pressure pad;
    a first resilient pressure pad in said first retaining means;
    a second resilient pressure pad in said second retaining means;
    fastening means for releasably retaining said bottom surface of said clamp plate means to said top surface of said circuit block means and defining a connector sub-assembly wherein said first openings are aligned with said second openings and said fastening means pass through said aligned first and second openings;
    first flexible circuit means sandwiched between said clamp plate means and said circuit block means, said first flexible circuit means extending through said longitudinal slot and being folded along said first resilient pressure pad;
    second flexible circuit means sandwiched between said clamp plate means and said circuit block means, said second flexible circuit means being wrapped about a longitudinal edge of said circuit block means and being folded along said second resilient pressure pad; and
    backer plate means for supporting a third circuit device, said backer plate means including a pair of opposed third openings in alignment with said aligned pairs of first and second openings in said connector sub-assembly, said fastening means extending through said aligned first, second and third openings and fastening said connector sub-assembly to said backer plate means to effect electrical connection between said first and second circuit means and a third circuit device.

2. The connector of claim 1 including:
    an alignment pin projecting from said bottom surface of said clamp plate means; and
    a recess in said top surface of said circuit block means for receiving said alignment pin.

3. The connector of claim 1 wherein:
    said bottom surface of said clamp plate means has a longitudinal raised portion and a longitudinal depressed portion separated by a shoulder.

4. The connector of claim 1 wherein:
    said clamP plate means and said circuit block means are substantially rectangular.

5. The connector of claim 1 wherein:
    said pairs of first, second and third openings respectively offset from one another.

6. The connector of claim 1 wherein said fastening means comprises a pair of threaded fasteners, each of said threaded fasteners including a circumferential groove for receiving a snap-ring and including:
    a snap-ring in said groove on each of said threaded fasteners wherein said sub-assembly is held together by said snap-rings on said fasteners thereby permitting said fasteners to be rotatable.

7. The connector of claim 1 wherein:
    first flexible circuit means has a shorter length than said second flexible circuit means.

8. The connector of claim 1 including a third circuit device comprising a multilayer circuit having terminal portions which have a staggered termination and wherein:
    said first and second flexible circuit means comprise multilayer circuit means having terminal portions which have a staggered termination, said staggered termination on said first and second flexible circuit means mating with said staggered termination on said third circuit device.

9. The connector of claim 1 including a third circuit device comprising a multilayer circuit having terminal portions which have a single plane termination and wherein:
    said first and second flexible circuit means comprise multilayer circuit means having terminal portions which have a single plane termination, said single plane termination on said first and second flexible circuit means mating with said single plane termination on said third circuit device.

10. The connector of claim 1 including:
    a third circuit device supported by said backer plate means and being adapted for connection with said first and second circuit means.

11. The connector of claim 1 including:
    strain relief means in said sub-assembly for relieving strain on said first and second flexible circuit means.

12. The connector of claim 11 wherein said strain relief means comprises:
    an elongated ridge extending longitudinally along said bottom surface of said clamp plate means; and
    an elongated groove extending longitudinally along said top surface of said circuit block means, said ridge and groove sandwiching therebetween said first and second flexible circuit means.

13. The connector of claim 1 wherein:
    said first retaining means and said second retaining means are positioned on opposed sides of said longitudinal slot.

14. The connector of claim 13 wherein:

each of said first and second retaining means comprises a depression in said bottom surfaces of said circuit block means.

15. The connector of claim 1 including a pair of first opposed apertures in a terminal portion of said first flexible circuit means and a pair of second opposed apertures in a terminal portion of said second flexible circuit means and including:
- a first pair of posts in said bottom surface of said circuit block means projecting outwardly from opposed ends of said first retaining means, said first pair of posts being received in said first opposed apertures; and
- a second pair of posts in said bottom surface of said circuit block means projecting outwardly from opposed ends of said second retaining means, said second pair of posts being received in said second opposed apertures.

16. The connector of claim 15 including:
- a first pair of apertures in said backer plate means for receiving said first pair of posts; and
- a second pair of apertures in said backer plate means for receiving said second pair of posts.

17. The connector of claim 16 including a third circuit device, said third circuit device including:
- a first pair of opposed holes aligned with said first pair of apertures and receiving said first pair of posts; and
- a second pair of holes aligned with said second pairs of opposed apertures and receiving said second pair of posts.

18. The connector of claim 1 including:
- a pair of fourth opposed openings in said circuit block means; and
- a pair of lugs projecting outwardly of said backer plate means for receiving said pair of fourth opposed openings.

19. The connector of claim 18 wherein:
said pair of fourth opposed openings are offset from one another.

20. The connector of claim 18 including a third circuit device, said third circuit device including:
- a pair of opposed holes aligned with said pair of fourth openings and receiving said pair of lugs.

21. An electrical connector for connecting at least two flexible circuits to a third circuit device, comprising:
- clamp plate means having a pair of opposed first openings, said clamp plate means having a top and bottom surface;
- circuit block means having a pair of opposed second openings, said circuit block means also having at least one longitudinal slot therethrough, said slot being dimensioned to receive a flexible circuit therethrough, said circuit block means having an upper and lower surface, said lower surface including first retaining means for receiving a first resilient pressure pad and second retaining means for receiving a second resilient pressure pad;
- a first resilient pressure pad in said first retaining means;
- a second resilient pressure pad in said second retaining means;
- fastening means for releasably retaining said bottom surface of said clamp plate means to said top surface of said circuit block means and defining a connector sub-assembly wherein said first openings are aligned with said second openings and said fastening means pass through said aligned first and second openings;
- first flexible circuit means sandwiched between said clamp plate means and said circuit block means, said first flexible circuit means extending through said longitudinal slot and being folded along said first resilient pressure pad;
- second flexible circuit means sandwiched between said clamp plate means and said circuit block means, said second flexible circuit means being wrapped about a longitudinal edge of said circuit block means and being folded along said second resilient pressure pad;
- backer plate means for supporting a third circuit device, said backer plate means including a pair of opposed third openings in alignment with said aligned pairs of first and second openings in said connector sub-assembly; and
- a third circuit device supported by said backer plate means, said fastening means extending through said aligned first, second and third openings and fastening said connector sub-assembly to said backer plate means to effect electrical connection between said first and second circuit means and said third circuit device.

* * * * *